United States Patent [19]
Venkatesh

[11] Patent Number: 4,672,241
[45] Date of Patent: Jun. 9, 1987

[54] HIGH VOLTAGE ISOLATION CIRCUIT FOR CMOS NETWORKS

[75] Inventor: Bhimachar Venkatesh, Sunnyvale, Calif.

[73] Assignee: Advanced Micro Devices, Inc., Sunnyvale, Calif.

[21] Appl. No.: 738,925

[22] Filed: May 29, 1985

[51] Int. Cl.$^4$ ............... H03K 19/096; H03K 17/687; H03K 19/20

[52] U.S. Cl. .................... 307/452; 307/579; 307/585; 307/296 R; 307/200 B

[58] Field of Search ............... 307/200 B, 443, 451, 307/452, 296 R, 297, 585, 579

[56] References Cited

U.S. PATENT DOCUMENTS 4,115,710  9/1978  Lou ............................ 307/200 B

FOREIGN PATENT DOCUMENTS 0057823  4/1983  Japan ......................... 307/200 B Primary Examiner—Stanley D. Miller
Assistant Examiner—M. R. Wanbach
Attorney, Agent, or Firm—Patent T. King; Davis Chin

[57] ABSTRACT

A high voltage isolation circuit for CMOS networks includes a N-channel MOS pass transistor for isolating a high voltage node from a low voltage node so as to prevent CMOS latch-up. There is provided a substrate of N-conductivity type and a P-conductivity region diffused in the substrate to form a PN junction. A supply potential is applied to the substrate. The pass transistor has a conduction path and a control electrode in which one end of the conduction path defines a first node for receiving thereat a first voltage, and the other end of the conduction path defines a second node for receiving thereat a second voltage. The first node is connected to the P-conductivity region. During a first mode of operation, the pass transistor is rendered more conductive so that the first node is coupled to the second node so that the second voltage follows the first voltage. During a second mode of operation, the pass transistor is rendered less conductive so that the second node is isolated from the first node so that the second voltage, which is allowed to be charged higher than the supply potential, is prevented from being applied to the P-conductivity region thereby avoiding latch-up.

7 Claims, 1 Drawing Figure

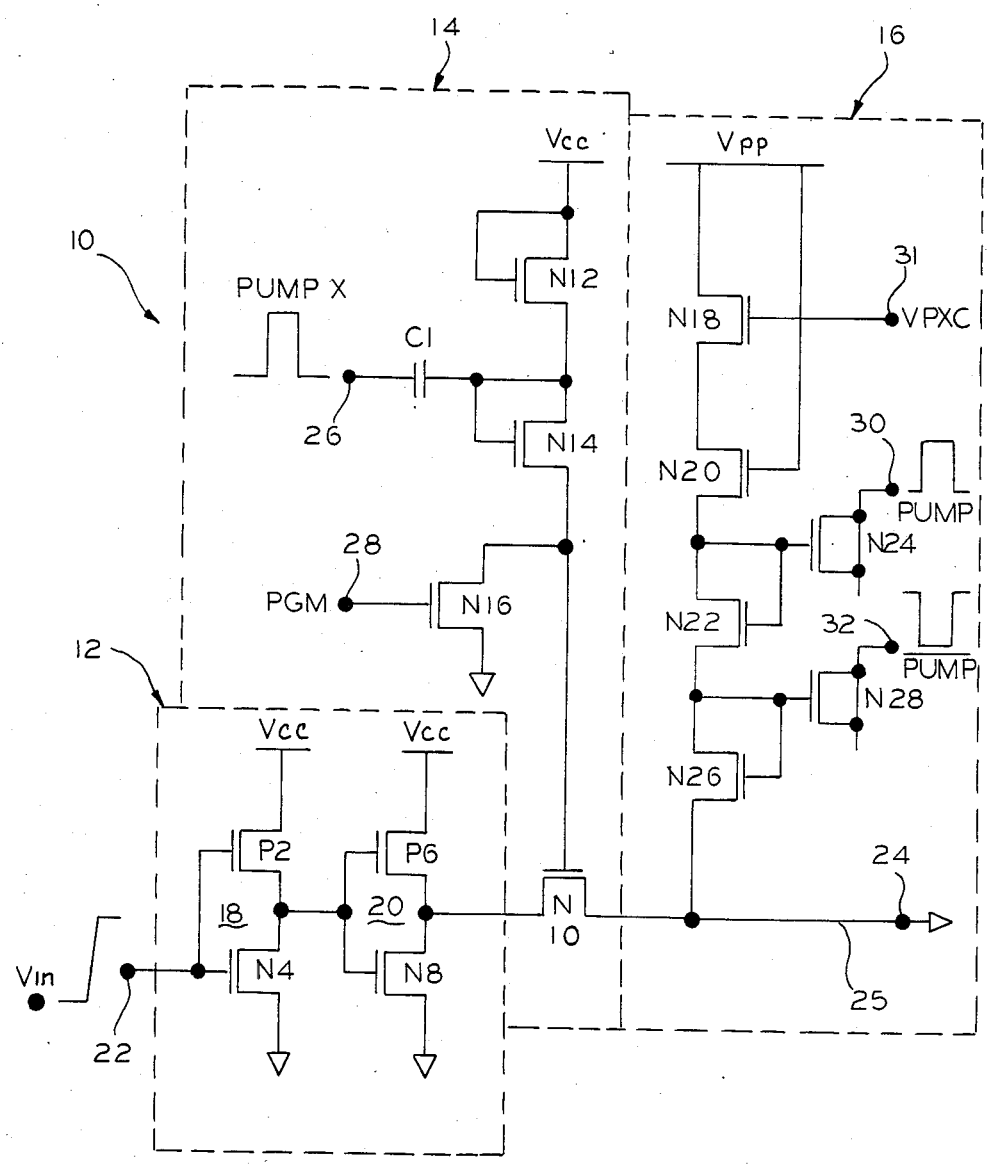

HIGH VOLTAGE ISOLATION CIRCUIT FOR CMOS NETWORKS

BACKGROUND OF THE INVENTION

This invention relates generally to isolation circuits, and more particularly, it relates to a high voltage isolation circuit for CMOS networks wherein a N-channel MOS pass transistor is used to isolate a high voltage node from a low voltage node so as to prevent CMOS latch-up.

As is well known, a CMOS network consisting of an inverter may be formed of a monolithic integrated circuit containing field-effect transistors (FET) in which regions of one conductivity, such as a P-type, are diffused in a substrate of a complementary conductivity, such as a N-type. A problem exists when different portions of the integrated circuit are operated at two different voltage levels. For example, if the P-conductivity type regions defining source and drain electrodes of the FET were operated at a first higher voltage (i.e, 15 volts) and the N-conductivity forming the substrate was operated at a second lower voltage (i.e., 5 volts), the PN junctions thus formed would be forward biased which can trigger a CMOS latch-up. As a result, excessive high currents may flow to cause burn-out of the junctions and destruction of the integrated circuits as well as effecting a possible damage to the power supply.

It would be therefore desirable to provide a high voltage isolation circuit for CMOS networks which includes a control device for isolating a high voltage node and a low voltage node.

SUMMARY OF THE INVENTION

There are provided a substrate of a N-conductivity type (N-well) and a P-conductivity region diffused in the substrate which forms a PN junction. A supply potential is applied to the substrate. The control device of the present invention is formed of a N-channel MOS pass transistor having a source and a drain forming the ends of a conduction path and a gate forming a control electrode. The drain is connected to the low voltage node and to the P-conductivity region. The source is connected to the high voltage node. The gate is used to render the pass transistor non-conductive so as to prevent the application of a high voltage at the high voltage node, which is higher than the supply potential, to the P-conductivity region. Consequently, the PN junction formed between this region and the substrate is never allowed to become forward biased, thereby avoiding CMOS latch-up.

Accordingly, it is a general object of the present invention to provide a high voltage isolation circuit for CMOS networks so as to prevent CMOS latch-up.

It is an object of the present invention to provide a high voltage isolation circuit for CMOS networks which includes a N-channel MOS pass transistor for isolating a high voltage node from a low voltage node thereby preventing CMOS latch-up.

It is another object of the present invention to provide a high voltage isolation circuit for CMOS networks which includes a control device having a conduction path wherein a first voltage is allowed to pass through the conduction path during a first mode of operation and wherein a second voltage is prevented from passing through the conduction path during a second mode of operation.

It is still another object of the present invention to provide a high voltage isolation circuit which includes a control device having a conduction path and a control electrode, and a pump circuit applied to the control electrode for allowing a first voltage to pass through the conduction path without causing a threshold voltage drop.

It is yet still another object of the present invention to provide an integrated circuit which includes a substrate of a N-conductivity type connected to a supply potential, a region of a P-conductivity type embedded within the substrate to form a PN junction therewith, and a control device to isolate the region from a voltage higher than the supply potential.

BRIEF DESCRIPTION OF THE DRAWINGS

These and other objects and advantages of the present invention will become more fully apparent from the following detailed description when read in conjunction with the accompanying drawing in which there is shown a typical schematic diagram of a high voltage isolation circuit for carrying out the principles of the instant invention.

DESCRIPTION OF THE PREFERRED EMBODIMENT

It is to be distinctly understood at the outset that the present invention shown in association with a portion of a decoder in an erasable, programmable read-only-memory (EPROM) is not intended to serve as a limitation upon the scope or teachings thereof, but is merely for the purpose of convenience of illustration of one example of its application. The present invention has numerous applications to other CMOS circuit designs since the invention pertains to an isolation circuit for isolating a high voltage node from a low voltage node so as to prevent CMOS latch-up.

Referring now in detail to the drawing of the particular illustration, there is shown a schematic diagram of a high voltage isolation circuit 10 for complementary metal-oxide-semiconductor (CMOS) networks which includes a CMOS input network section 12, a control network section 14, and an output network section 16. In the embodiment of the invention, the transistors of P-conductivity type are identified by the letter P followed by a reference numeral and the transistors of N-conductivity type are identified by the letter N followed by a reference numeral. The output network section 16 is operated with a first higher power supply voltage or potential VPP which is approximately +11 volts. The input network section 12 and the control network section 14 are operated with a second lower power supply voltage or potential VCC which is approximately +5 volts.

The CMOS input network section 12 is formed of a first inverter 18 and a second inverter 20. The first inverter 18 is formed of a P-channel MOS transistor P2 and a N-channel MOS transistor N4 whose gate electrodes are tied together and to an input terminal 22 for receiving an input signal $V_{in}$. The input signal $V_{in}$ swings typically between a low or "0" logic level in the order of 0 volts and a high or "1" logic level of approximately +5 volts. The drain electrodes of the transistors P2 and N4 are also tied together and define the output of the first inverter 18. The source of the transistor P2 is connected to the lower power supply voltage VCC, and the source of the transistor N4 is connected to a ground potential. The second inverter 20 is formed of a P-channel MOS transistor P6 and a N-channel MOS transistor N8 whose gate electrodes are connected together and to the output of the first inverter 18. The drain electrodes of the transistors P6 and N8 are also connected together and define the output of the second inverter 20. The source of the transistor P6 is tied to the supply potential VCC, and the source of the transistor N8 is tied to the ground potential.

The control network section 14 includes a control means consisting of a N-channel MOS pass transistor N10 having its drain electrode connected to the output (node 3) of the input network section 12 at the common drains of the transistors P6 and N8. The source electrode of the transistor N10 is connected to the output network sections 16 and to an output terminal section 24 via a lead line 25. The source and drain of the transistor N10 define the ends of its conduction path, and the gate electrode of the transistor N10 lying between the conduction path controls its conduction. The drain of the transistor N10 connected to the node 3 defines a first low voltage node for receiving thereat a first voltage. The source of the transistor N10 connected to node 5 define a second or high voltage node for receiving thereat a second voltage. The magnitude of the first voltage is no greater than the supply potential VCC, and the magnitude of the second voltage is higher than the first voltage and the supply potential VCC. In fact, the magnitude of the second voltage is even higher than the supply potential VPP.

A N-channel MOS transistor N12 has its drain and gate electrodes connected together and to the low power supply potential VCC. The transistor N12 serves as a combination of a current-limiting resistor and as a diode. The source of the transistor N12 is connected to the drain and gate electrodes of a N-channel MOS charge transfer transistor N14 functioning as a diode and to one end of a capacitor C1. The other end of the capacitor C1 is connected to an input terminal 26 for receiving positive pulses PUMPX from a free-running oscillator (not shown). The source of the transistor N14 is connected to the drain of a program mode transistor N16 and to the gate of the pass transistor N10. The gate of the transistor N16 is connected to an input terminal 28 for receiving a program mode or mode selection voltage which swings between a low logic level for a first mode of operation and a high logic level for a second mode of operation. The source of transistor N16 is connected to the ground potential.

The output network section 16 includes a N-channel MOS switching transistor N18 having its drain conencted to the higher power supply potential VPP, its gate connected to a logic voltage VPXC, and its source connected to the drain of a N-channel MOS transistor N20. The transistor N20 functions as a combination current-limiting resistor and as a diode. The gate of the transistor N20 is also connected to the higher power supply potential VPP. The source of the transistor N20 is tied to the drain and gate electrodes of a N-channel MOS charge transfer transistor N22 functioning as a diode. A N-channel MOS transistor N24 has its drain and source electrodes connected together and its gate electrode connected to the source of the transistor N20 so as to function as a capacitor. The common drain and source electrodes of the transistor N24 is tied to an input terminal 30 for receiving positive pulses PUMP from a second oscillator (not shown). The source of the transistor N22 is tied to the drain and gate electrodes of a N-channel MOS charge transfer transistor N26 functioning as a diode. A N-channel MOS transistor N28 has its drain and source electrodes connected together and its gate electrode connected to the source of the transistor N22 so as to function as a capacitor. The common drain and source electrodes of the transistor N28 is tied to an input terminal 32 for receiving positive complement pulses $\overline{\text{PUMP}}$ from the second oscillator. The source of the transistor N26 is coupled to the output terminal 24. The second node 5 is also connected by connecting means to the output terminal 24.

As is generally known, integrated circuits containing field-effect transistors include regions of one conductivity (i.e., P-type) formed in or on a substrate of a complementary conductivity type (i.e., N-type). A P-channel field-effect transistor may be formed of two adjacent diffused source and drain regions defining the ends of a conduction channel and a control electrode overlying the channel for controlling its conductivity. At the interfaces between the diffused regions and the substrate, PN junctions are formed.

With specific reference to the P-channel transistor P6, it will be noted that its source and drain regions are of the P-conductivity type which are diffused or embedded in the substrate of N-conductivity type. This N-conductivity type substrate is assumed to be connected to the lower power supply potential VCC. As previously discussed, the drain region of P-conductivity type of the transistor P6 is connected by connecting means to the first node for receiving a first voltage. Thus, the most positive voltage that can be received at the first node (node 3) or drain region of the transistor P6 must be no greater than the supply potential VCC to prevent forward conduction through the PN junction it forms with the substrate. Since the substrate of the transistor P6 is assumed to be operated at the supply potential VCC, the drain region of the transistor P6 at the first node must be isolated from a voltage higher than the supply potential VCC which appears at the second node (node 5). While the PN junction illustrated in the transistor P6 is in the CMOS inverter 20, it should be clearly understood by those skilled in the art that the PN junction may be part of any other CMOS circuit design.

The integrated circuit embodying the invention depicted in the drawing was designed for use in the decoder of an EPROM. During a read mode or first mode of operation, the first oscillator at the input terminal 26 is turned on, the second oscillator at the input terminal 30 and 32 are turned off, and the program mode voltage at the input terminal 28 is in the low logic level so as to turn off the transistor N16. Further, the logic voltage VPXC at input terminal 31 is also in a low logic level so as to render the transistor N18 to be non-conductive. The positive pulses PUMPX will charge up the capacitor C1 and will transfer its voltage to the gate (node 4) of the transistor N10 via the charged transfer transistor N14 so as to pump up voltage above the lower power supply potential VCC.

Assuming initially that the input voltage $V_{in}$ is in the low logic level, a voltage of 0 volts will be received at the drain (node 3) of the transistor N10. Since the voltage applied to the gate of the transistor N10 has been pumped up to a level higher than the supply potential VCC, the transistor N10 is rendered more conductive so that the first voltage at the first node is allowed to pass through the conduction path to reach the second node (node 5). Thus, the output voltage on the terminal 24 will be the same as the voltage at the first node.

As the input voltage $V_{in}$ switches to the high logic level, node 3 will charge up to the supply potential VCC. This causes the transistors N10 to be overdriven and clamps the voltage at the second node to the supply voltage VCC at the first node, thereby permitting substantially the full supply potential VCC without a threshold voltage drop to be applied to the output terminal. In other words, during the read mode, the first voltage received at the low voltage node is allowed to pass through the conduction path to the high voltage node so that the voltage at the output terminal will follow the first voltage without the loss of a threshold voltage drop.

During a write mode or second mode of operation, the first oscillator is turned off, the second oscillator is turned on, and the program mode voltage is in a high logic level so as to turn on the transistor N16. Further, the logic voltage at the terminal 31 will also be in a high logic level so as to turn on the transistor N18 which allows the higher power supply potential VPP to be applied to the drain of the transistor N20. As a consequence, the gate of the transistor N10 (node 4) will be biased around one-half of the supply potential VCC or VCC/2, thereby permitting the transistor N10 to be partially turned on. Thus, when the input voltage $V_{in}$ is switched from the low logic level to the high logic level, the initial voltage at the low voltage node will be passed through the channel to the high voltage node until the time when the second node reaches a level which is one threshold voltage drop below the gate voltage. At that time, the transistor N10 will be rendered less conductive or turned off. As a result, the second or high voltage node (node 5) is isolated from the first or low voltage node (node 3) by way of the conduction path of the transistor N10. The positive pulses PUMP and its complement pulses $\overline{\text{PUMP}}$ will pump the level of the second voltage at the second node via the transistors 22, 24, 26 and 28 to a second voltage which is higher than the supply potentials VCC and VPP.

It will be noted that if the transistor N10 was to remain turned on, the second higher voltage will be passed from the second node through the conduction path to the first node and then be applied to the P-conductivity type region (drain) of the transistor P6. Since the N-conductivity type substrate region of the transistor P6 was assumed to be tied to the lower power supply potential VCC, this would cause the PN junction to be forward biased, resulting in a CMOS latch-up. By turning off automatically the transistor N10 during the write mode of operation, the output terminal 24 is allowed to be pumped up to the second or higher voltage (which is higher than the first voltage and the supply potential VCC) without causing latch-up in the CMOS inverter. Further, by turning on the transistor N10 during the read mode of operating, the output terminal 24 is allowed to follow the first voltage received at the first low voltage node, thereby charging up all the way to the lower power supply potential VCC without the loss of a threshold voltage drop.

The invention has been illustrated in connection with a decoder of an EPROM. But, clearly, the invention is applicable for any monolithic integrated circuit containing a N-conductivity type operated at a supply voltage and a P-conductivity type region which is to be isolated from a voltage which is charged up beyond the supply potential. A N-channel MOS transistor N10 has been used to couple the low voltage node to the high voltage node during a first mode of operation and to isolate the high voltage node from the low voltage node during a second mode of operation.

From the foregoing detailed description, it can thus be seen that the present invention provides a high voltage isolation circuit for CMOS networks so as to prevent CMOS latch-up. A N-channel MOS pass transistor is employed to isolate a high voltage node from a low voltage node so as to prevent the forward bias of a PN junction, thereby avoiding latch-up.

While there has been illustrated and described what is at present to be a preferred embodiment of the present invention, it will be understood by those skilled in the art that various changes and modifications may be made, and equivalents may be substituted for elements thereof, without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A high voltage isolation circuit for CMOS networks comprising:

input means including a substrate of N-conductivity type and a P-conductivity region diffused in said substrate to form a PN junction;

means for applying a supply potential to said substrate;

control means including an N-channel MOS pass transistor, said pass transistor having a source and a drain forming the ends of a conduction path and a gate for forming a control electrode, one end of the conduction path defining a first node for receiving thereat a first voltage, the other end of the conduction path defining a second node for receiving thereat a second voltage, said first voltage being of a magnitude which is no greater than the supply potential, said second voltage being of a magnitude which is higher than said first voltage and the supply potential;

means for connecting said first node to said P-conductivity region;

output means connected to the second node for pumping the second node to the second higher voltage;

means for connecting the second node to an output terminal;

said control means further including an N-channel MOS program mode transistor, said program mode transistor having its drain connected to said gate of said pass transistor, its gate connected to receive a mode selection voltage swinging between a low logic level and a high logic level, and its source connected to a ground potential;

said drain of said program mode transistor generating a low mode selection voltage when the mode selection voltage of the low logic level is received at its gate and generating a high mode selection voltage when the mode selection voltage of the high logic level is received at its gate;

said control electrode of said control means being responsive to the low mode selection voltage for allowing said first voltage at the first node to pass through the conduction path to the second node so that the voltage at the output terminal will follow the first voltage when said output pumping means is inactivated;

second pumping means for pumping the voltage at the gate of said pass transistor to a level higher than the first voltage so that the first voltage is passed through said conduction path to the second node without a threshold voltage drop; and said control electrode of said control means being responsive to the high mode selection voltage for preventing said second voltage at the second node to pass through said conduction path to the first node so that the first node will be isolated from the second voltage at the second node when said output pumping means is activated, thereby avoiding a forward bias of the PN junction.

2. An isolation circuit as claimed in claim 1, wherein said input means includes a first inverter and a second inverter, said first inverter having an input for receiving an input signal and its output being connected to the input of said second inverter, said second inverter having its output connected to said first node.

3. An isolation circuit as claimed in claim 1, wherein said output pumping means is formed of at least a first N-channel MOS transistor having its drain and source electrodes connected together and a second N-channel MOS transistor having its drain and gate electrodes connected together and to the gate of said first transistor, the source of said second transistor being coupled to said output terminal, said first transistor functioning as a capacitor and said second transistor functioning as a diode.

4. An isolation circuit as claimed in claim 1, wherein said input means includes an input terminal for applying thereto an input signal.

5. An isolation circuit as claimed in claim 2, wherein said second inverter is formed of a P-channel MOS transistor and a N-channel MOS transistor.

6. An isolation circuit as claimed in claim 5, wherein said P-channel transistor has a drain defining the P-conductivity type region which is diffused in the N-conductivity type substrate.

7. An isolation circuit as claimed in claim 1, wherein said second pumping means is formed of a capacitor and a N-channel MOS charge transfer transistor having its drain and gate electrodes connected together and to one end of said capacitor, the source electrode of charge transfer transistor being connected to the gate electrode of said pass transistor.

* * * * *